United States Patent [19]

Hornhauer et al.

[11] Patent Number: 5,502,965
[45] Date of Patent: Apr. 2, 1996

[54] DEVICE FOR GENERATING OPERATING STATES CHARACTERIZED BY DIFFERENCES IN HEIGHT IN MECHANICAL ACTUATORS

[75] Inventors: Henry Hornhauer; Michael Weinholdt, both of Jena, Germany

[73] Assignee: PTS Gesellschaft fuer Physikalisch-Technische Studien Jena mbH, Jena, Germany

[21] Appl. No.: 374,322

[22] Filed: Jan. 18, 1995

[30] Foreign Application Priority Data

Feb. 8, 1994 [DE] Germany ................. 44 03 831.3

[51] Int. Cl.⁶ ..................................... F15B 21/06
[52] U.S. Cl. .............. 60/326; 137/251.1; 137/909; 101/29; 400/109.1; 400/124.14
[58] Field of Search .............. 60/326; 137/251.1, 137/909; 101/3.1, 28, 29; 400/109.1, 124.14; 434/112, 113

[56] References Cited

U.S. PATENT DOCUMENTS

| | | | |
|---|---|---|---|
| 4,840,112 | 6/1989 | Bhadra et al. | 60/326 |
| 5,099,884 | 3/1992 | Monahan . | |
| 5,209,584 | 5/1993 | Galarneau . | |
| 5,222,895 | 6/1993 | Fricke | 434/113 |

FOREIGN PATENT DOCUMENTS

| | | |
|---|---|---|
| 0448187 | 9/1991 | European Pat. Off. . |
| 289380 | 4/1991 | German Dem. Rep. . |
| 2601248 | 7/1977 | Germany . |
| 3035852 | 5/1982 | Germany . |
| 3929275 | 3/1991 | Germany . |
| 4007945 | 9/1991 | Germany . |
| 4012267 | 11/1991 | Germany . |
| 4133000 | 11/1993 | Germany . |
| 1317406 | 6/1987 | U.S.S.R. ................. 137/909 |
| 2120806 | 12/1983 | United Kingdom . |
| 2212336 | 7/1989 | United Kingdom . |

Primary Examiner—F. Daniel Lopez
Attorney, Agent, or Firm—McAulay Fisher Nissen Goldberg & Kiel

[57] ABSTRACT

A device is described for generating operating states characterized by differences in height in actuators arranged in a matrix. In order to enable operating states which are characterized by differences in height to be produced in mechanical actuators in close matrix-type arrangement which are controllable selectively and independently from one another in a simple manner in a suitable device a reservoir filled with electroviscous liquid has an over-pressure chamber and a negative-pressure chamber and these chambers are connected via separate control ducts with hydraulic cylinders of the actuators, the connection to the two chambers of the reservoir being opened or blocked alternatively by the two control ducts of an actuator via a first electrode and a second electrode and a controllable center electrode common to both. The pressure variation formed in this way changes the vertical adjustment of a mechanical pin via an elastomer diaphragm. The device is used primarily for adaptive circuit board testers and for representing braille text.

10 Claims, 2 Drawing Sheets

DEVICE FOR GENERATING OPERATING STATES CHARACTERIZED BY DIFFERENCES IN HEIGHT IN MECHANICAL ACTUATORS

BACKGROUND OF THE INVENTION a) Field of the Invention

The invention is directed to a device for generating operating states characterized by differences in height in mechanical actuators such as those preferably used for tactile representation of braille text and for adapters in circuit board testers.

b) Description of the Related Art

Actuators which can be vertically adjusted mechanically are often arranged in matrix form in technical applications to realize different operating states. For example, in known adapters for circuit board testers, contact needles are plugged in manually or by means of specific handling techniques in a grid or raster in matrix form corresponding to the measurement task at hand. In some instances, this is very time-consuming and its use is limited to existing adapters.

Other devices for producing vertically adjusted actuators which are required to be selectively controllable are known for representing braille text, in particular in computer display modules or typewriter display modules. In principle, there are two different methods of realization. On the one hand, piezoelectric deflection elements or bending elements are used for vertical adjustment. These bending elements being limited to row or line arrangements due to their required constructional size. On the other hand, hydraulic systems are known which achieve matrix arrangements and are operated via electroviscous liquids. An example of such a device is disclosed in DE-OS 40 07 945. In this case, the display elements are realized by hydraulically adjustable lifting elements and are operated in that periodic changes in pressure at appropriate frequencies are impressed on the liquid in a reservoir so that the pressure curve at all control channels or control ducts has only small phase differences. A control electrode in every control duct is connected to d.c. voltage at the same frequency at which the changes in pressure are effected. The value of the phase angle between the changes in pressure and the voltage pulses regulates the volume in the work space of the display element and accordingly the tactile opposing pressure of the display element.

A disadvantage consists in that only small actuating or adjusting paths and small pressure differences can be produced. Further, circulation of the electroviscous liquid is impossible, which fosters separating processes.

OBJECT AND SUMMARY OF THE INVENTION

Therefore, it is a primary object of the present invention to enable operating states which are characterized by differences in height to be produced in mechanical actuators so as to realize lifting movements of the actuators in close matrix-type arrangement selectively and independently from one another in a simple manner. Moreover, separation of the liquid should be prevented.

According to the invention, in a device for generating operating states characterized by differences in height in mechanical actuators which are adjustable hydraulically, operated by means of an electroviscous liquid and have control ducts which are provided with electrodes and permit or prevent the flow of liquid depending on the applied voltage, this object is met in that every actuator contains a hydraulic cylinder communicating with an over-pressure chamber and a negative-pressure chamber via two control ducts, in that one of the control ducts is connected with the over-pressure chamber and the other is connected with the negative-pressure chamber, and in that each control duct of an actuator has either a first electrode or a second electrode which are fixed at different potentials in the operating state, as well as a center electrode common to both electrodes, which center electrode is the only control electrode of every actuator and can be switched within the scope of the difference in potential between the first electrode and second electrode so that flow is permitted in one control duct and prevented in the other control duct depending on the difference in potential.

The hydraulic cylinders are preferably formed by an elastomer membrane or diaphragm. A plurality of hydraulic cylinders are advisably combined to form a module (e.g., an eight-element module for braille text).

All hydraulic cylinders are advantageously arranged as a two-dimensional matrix on the unified or overall reservoir.

The necessary pressure differences between the over-pressure chamber and negative-pressure chamber are advantageously produced by means of a pump. Gear pumps are particularly suitable for this purpose. Further, both chambers advisably have a gas cushion which serves as a buffer for regulating pressure.

The first and second electrodes of different actuators are advantageously connected with one another in forming the modules and matrix arrangements, one group of electrodes being connected to reference potential and the other group being connected to operating voltage, and the center electrode can be switched, as is appropriate, to one of the potentials of the two groups.

All electrodes of the actuators are advantageously controlled via a start-up routine control which, in addition to setting the necessary pressure difference between the over-pressure chamber and negative-pressure chamber, ensures that all electrodes, at least by module, can be switched to the same potential for the purpose of rinsing the respective hydraulic cylinders in a start-up phase. This start-up routine control is advisably also activated cyclically during longer breaks in operation in order to prevent separation processes in the electroviscous liquid.

The invention is based on the idea that it is necessary, in order to realize closely spaced matrix arrangements and a distinct difference between the operating states of the actuators, to construct a device whose actuators are characterized by a small space requirement laterally, by simple actuation and by relatively large actuating paths. The simple actuation in the use of electroviscous liquids provides the necessary precondition for this purpose. In so doing, an over-pressure chamber or negative-pressure chamber can be alternately connected with the hydraulic cylinders of the actuators for the vertical adjustment of the actuators according to the invention. This switchable connection for generating pressure differences in the hydraulic cylinders is realized by two alternative conducting control ducts by means of two electrodes at different constant potentials and a controllable center electrode which can be regulated between the two constant potentials. The separate inlet and outlet valves produced in this way achieve a circulation of liquid which can be controlled in a simple manner and results in thorough circulation of the electroviscous liquid.

By means of the device according to the invention, it is possible to generate differences in height at mechanical actuators in a closely spaced matrix arrangement selectively and independently from one another in a simple manner. Relatively great pressure differences and actuating paths can be realized in this way. Moreover, the principle of hydraulic cylinders through which a flow is conducted enables complete circulation of the electroviscous liquid so as to prevent separation of the liquid components.

The invention will be explained more fully in the following with reference to embodiment examples.

DESCRIPTION OF THE PREFERRED EMBODIMENTS

Figure 1:
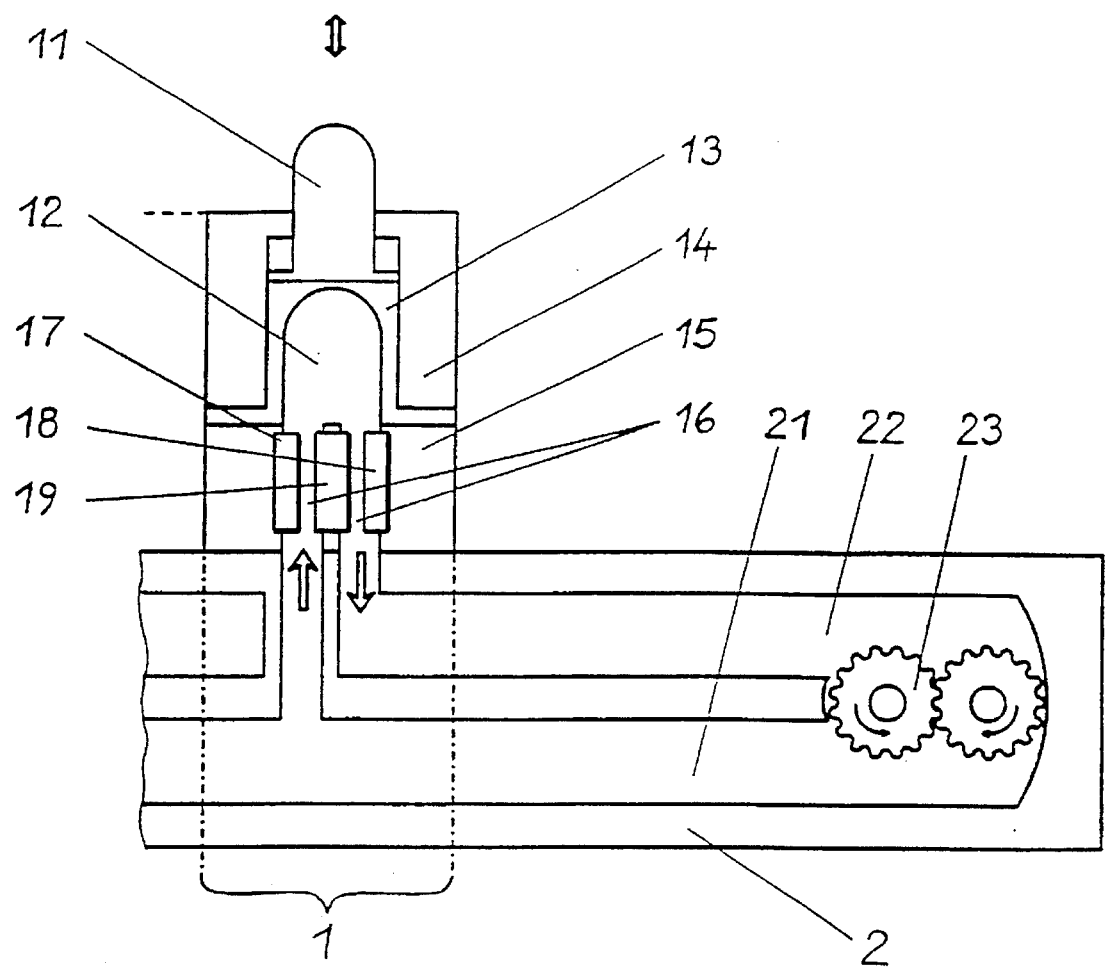
FIG. 1 shows a basic diagram of the device according to the invention with an actuator 1.

In its basic construction, which is shown schematically in FIG. 1, the device according to the invention has actuators 1, each of which contains a pin 11 which is vertically adjustable mechanically by means of the change in volume in a hydraulic cylinder 12. The device has a body 2 with an over-pressure chamber 21 and a negative-pressure chamber 22 which communicate with the hydraulic cylinder 12 of an actuator 1 via one of two control ducts 16 of the actuator 1. An electroviscous liquid is used as an operating medium. The actuators 1 according to the invention, only one of which is shown by way of example in FIG. 1, are advisably assembled in modular construction on the reservoir 2 serving as support. Together, the modules 3 form a matrix. These modules 3 can be in line formation or in planar formation (e.g., line modules for printed circuit boards, 8-member braille element).

Each actuator 1 has a base plate 15 in which two (preferably rectangular) control ducts lead to the reservoir 2, an elastomer diaphragm 13 which encloses the hydraulic cylinder 12, the pin 11 being supported at the upper surface of the diaphragm 13, and a cover plate 14. Each control duct 16 has a constant-potential electrode and a common center electrode 19 as control electrode which are advisably in parallel position relative to one another. The constant-potential electrodes are connected to different potentials and are therefore designated in the following as first electrode 17 and second electrode 18 for each actuator 1. The first electrode 17, for example, is connected to reference potential and the second electrode 18 is connected to operating voltage. The potential of the center electrode 19 changes from one to the other. In the simplest case, it is selectively switched to one of the two potentials. In this way an electric field is generated in only one control duct to prevent flow. A pump between the over-pressure chamber 21 and the negative-pressure chamber 22 provides for the permanent pressure difference between the two chambers required for operation. A gear pump 23, shown schematically in FIG. 1, is suitable for this purpose, for example. However, this function may be performed by any optional liquid pump, e.g., centrifugal pumps, diaphragm pumps, or the like.

This construction design forms the basis for the following operation: When put into operation, the gear pump 23 is started and provides for a pressure difference between the over-pressure chamber 21 and the negative-pressure chamber 22. This pressure difference is advantageously buffered by corresponding gas cushions in the two chambers. When the first electrode 17 and second electrode 18 are connected as indicated above and assuming that the center electrode 19 is connected to the same potential as the first electrode 17, the electroviscous liquid flows through the left-hand control duct 16 of the actuator 1 shown in FIG. 1. In the right-hand control duct 16, the difference in potential between the center electrode 19 and second electrode 18 impedes the flowability of the electroviscous liquid, i.e., its viscosity is increased until the liquid is virtually solidified. Accordingly, a pressure identical to that in the over-pressure chamber 21 is built up in the hydraulic cylinder 12 of the actuator 1 and the pin 11 is pushed out into its upper functionally determined operating state due to the expansion of the elastomer diaphragm.

Figure 2:
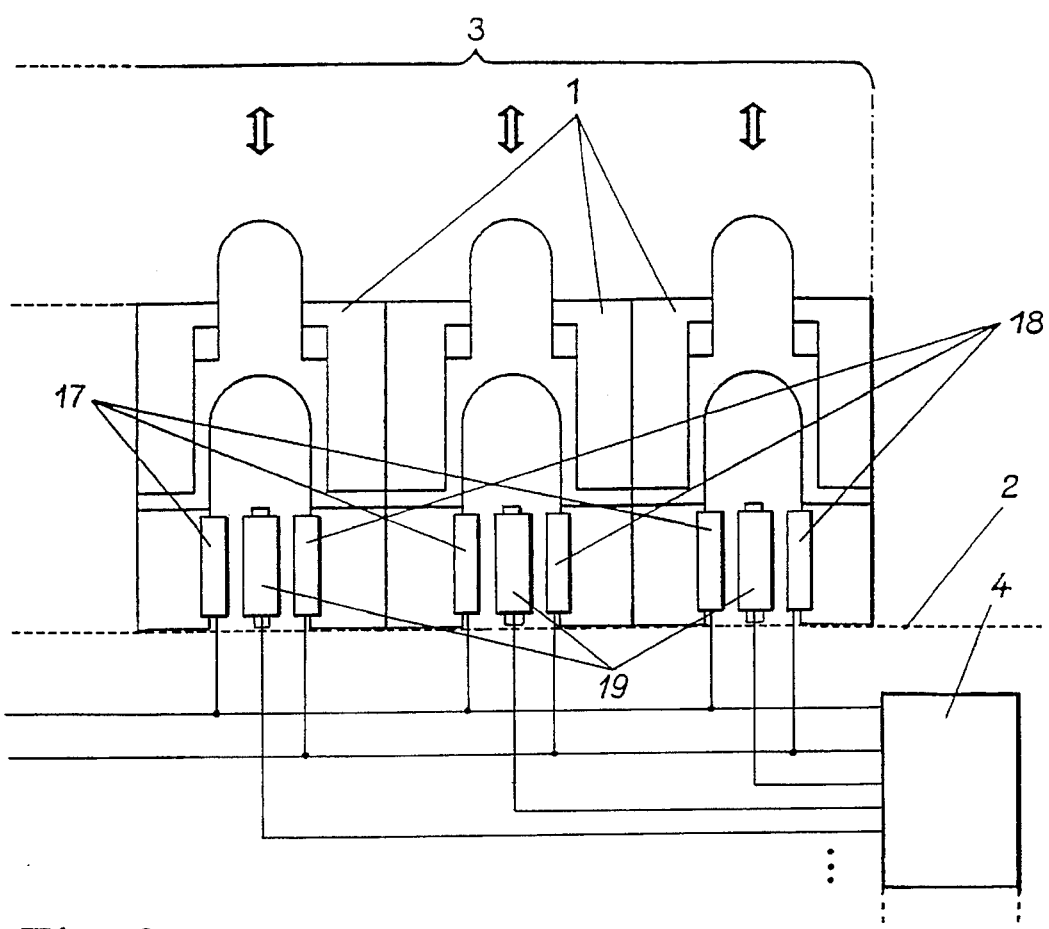
FIG. 2 shows the electrode and switching diagram in a module with three actuators.

If the polarity of the center electrode 19 is then switched to the potential of the second electrode, the left-hand control duct 16 is blocked and the right-hand control duct 16 is opened. A pressure compensation takes place in that the connection to the negative-pressure chamber 22 is opened. The resulting negative pressure causes the pin 11 to be returned or reset within the guide of the cover plate 14. For reasons of cost (but also for function-related considerations), it is advisable when constructing an entire matrix of actuators 1 to combine the actuators 1 in modules 3. In this way at least the first and second electrodes 17 and 18, respectively, of the actuators 1 of a module 3 will be connected with one another as shown in FIG. 2. However, in many cases it is advisable to link a plurality of modules 3 to collection lines by suitable connections.

The electroviscous liquid is continuously circulated in order to prevent separation. In normal operation, this is effected by means of the delayed flow through each actuator 1 during a change in the control of the center electrode 19. When operation is resumed after a break or during long breaks in operation, the hydraulic cylinders 12 of all actuators 1 must be rinsed. In order to produce an intensive rinsing effect also within larger matrix arrangements of actuators 1, the actuators 1 are electrically short-circuited one after the other module by module or in a plurality of modules 3 by means of a start-up routine control 4 (shown only schematically in FIG. 2), i.e., all electrodes 17, 18 and 19 of a selected group of actuators 1 or modules 3 are disconnected from their potential within the start-up routine control 4 and connected to uniform potential. In this way, both control ducts 16 of the actuators 1 in question conduct simultaneously and, when the gear pump 23 is running, electroviscous liquid flows through the hydraulic cylinders 12 at high speed. The start-up routine control 4 is used in the same manner for cyclical rinsing of the hydraulic cylinders 12 during longer breaks in operation by simulating a timed control of the start-up routine.

As regards the connection scheme of the electrodes, it does not really matter which electrode 17 or 18 is at a higher potential. However, it is advisable to change the potentials of the first and second electrodes 17 and 18, respectively, in determined time intervals (possibly even cyclically) in order to prevent the constituents of the electroviscous liquid from precipitating on the surfaces of the electrode.

It is noted with reference to the connection scheme shown in FIG. 2 that only the center electrodes 19, which must be controllable separately, are guided through the reservoir 2. The collection lines of the first and second electrodes 17 and 18, respectively, can be guided laterally out of the matrix arrangement at an optional location. To this extent, the diagram shown in FIG. 2 is not representative of their position, since placement through the reservoir could cause the viscosity of the liquid to be influenced in an undesirable manner.

The device according to the invention is suitable for different applications requiring a defined vertical adjustment of actuators 1 arranged as points within a confined space, which vertical adjustment is required in a line or plane. The device has proven useful primarily as a suitable variant for electronic representation of braille text and corresponding image matrix displays, but also for the control of adapters for circuit board testers.

While the foregoing description and drawings represent the preferred embodiments of the present invention, it will be obvious to those skilled in the art that various changes and modifications may be made therein without departing from the true spirit and scope of the present invention.

LIST OF REFERENCE NUMBERS 1 actuator
11 pin
12 hydraulic cylinder
13 elastomer diaphragm
14 cover plate
15 base plate
16 control ducts
17 first electrode
18 second electrode
19 center electrode
2 reservoir
21 over-pressure chamber
22 negative-pressure chamber
23 gear pump
3 module
4 start-up routine control

What is claimed is:

1. A device for generating operating states characterized by differences in height in mechanical actuators comprising:
   a plurality of mechanical actuators which are adjustable hydraulically and are operated by electroviscous liquid, said actuators having control ducts which are provided with electrodes and permit or prevent the flow of liquid depending on the applied voltage;
   each actuator containing a hydraulic cylinder;
   a body including an over-pressure chamber and a negative-pressure chamber, said hydraulic cylinder communicating with said over-pressure chamber and said negative-pressure chamber by way of two control ducts, one of said two ducts being connected with said over-pressure chamber and the other being connected with the negative-pressure chamber;
   each control duct of an actuator having either a first electrode or a second electrode which are fixed at different potentials in the operating state, as well as a center electrode common to said first and second electrodes, said center electrode being the only control electrode of each actuator, said center electrode being switchable within the range of the difference in potential between the first electrode and second electrode so that flow is permitted in one control duct and prevented in the other control duct depending on the difference in potential.

2. The device according to claim 1, wherein each hydraulic cylinder is formed by an elastomer diaphragm which is expandable only in the vertical direction through cylindrical recesses in a cover plate.

3. The device according to claim 1, wherein all actuators are arranged as a two-dimensional matrix on the body which, at the same time, serves as a uniform substrate or support for these actuators.

4. The device according to claim 1, wherein the difference in pressure between the over-pressure chamber and negative-pressure chamber is produced by a pump.

5. The device according to claim 4, wherein said pump is a gear pump.

6. The device according to claim 4, wherein the over-pressure chamber and negative-pressure chamber each have a gas cushion serving as buffer for regulating pressure.

7. The device according to claim 1, wherein a plurality of actuators are combined to form a module.

8. The device according to claim 7, wherein a group of first electrodes of different actuators are connected together and to one of a reference potential and an operating voltage, a group of second electrodes of different actuators are connected together and to the other of said reference and operating voltages, and each center electrode can be individually switched to either said reference potential or said operating voltage.

9. The device according to claim 7, wherein all electrodes of the actuators are controlled via a start-up routine control which, in addition to setting a necessary pressure difference between the over-pressure chamber and negative-pressure chamber, ensures that all electrodes, at least by module, can be switched to the same potential for the purpose of rinsing the respective hydraulic cylinders in a start-up phase.

10. The device according to claim 9, wherein the start-up routine control can also be switched on cyclically during longer breaks in operation in order to prevent separation processes in the electroviscous liquid.

* * * * *